United States Patent
Macheiner et al.

(10) Patent No.: US 8,704,269 B2
(45) Date of Patent: Apr. 22, 2014

(54) DIE PACKAGE

(75) Inventors: Stefan Macheiner, Kissing (DE); Andreas Peter Meiser, Unterhaching (DE)

(73) Assignee: Infineon Technologies AG, Neubiberg (DE)

(*) Notice: Subject to any disclaimer, the term of this patent is extended or adjusted under 35 U.S.C. 154(b) by 199 days.

(21) Appl. No.: 12/975,448

(22) Filed: Dec. 22, 2010

(65) Prior Publication Data
US 2012/0161128 A1    Jun. 28, 2012

(51) Int. Cl.
*H01L 29/74* (2006.01)

(52) U.S. Cl.
USPC .................................... 257/107; 257/108

(58) Field of Classification Search
USPC ............ 257/48, 107, 108, 119, 175; 318/254, 318/432, 400.27, 798; 320/136; 363/131
See application file for complete search history.

(56) References Cited

U.S. PATENT DOCUMENTS

| | | | | |
|---|---|---|---|---|
| 4,079,609 | A * | 3/1978 | Hodgskiss | 72/15.5 |
| 7,705,470 | B2 | 4/2010 | Otremba | |
| 7,834,575 | B2 * | 11/2010 | Hauenstein | 318/569 |
| 8,593,817 | B2 | 11/2013 | Bayerer et al. | |
| 2005/0121777 | A1 * | 6/2005 | Hata et al. | 257/713 |
| 2006/0169976 | A1 * | 8/2006 | Kameda et al. | 257/44 |
| 2007/0052379 | A1 * | 3/2007 | Suh | 318/254 |
| 2008/0191342 | A1 * | 8/2008 | Otremba | 257/723 |
| 2012/0012924 | A1 | 1/2012 | Meiser et al. | |

FOREIGN PATENT DOCUMENTS

| | | |
|---|---|---|
| DE | 102006038541 A1 | 2/2008 |
| DE | 102006037118 B3 | 3/2008 |
| DE | 102009045181 A1 | 4/2011 |
| JP | 200773581 A | 3/2007 |

OTHER PUBLICATIONS

English language abstract for JP 2007-73581 A.
German Office Action, dated Sep. 30, 2013.

* cited by examiner

*Primary Examiner* — Cuong Q Nguyen
*Assistant Examiner* — Yosef Gebreyesus

(57) ABSTRACT

According to one embodiment, a die package is provided comprising a first die structure with a first plurality of switching elements wherein controlled current input terminals of the first plurality of switching elements are electrically coupled by a common contact region and wherein controlled current output terminals of the first plurality of switching elements are insulated from each other; a second die structure with a second plurality of switching elements wherein controlled current output terminals of the second plurality of switching elements are coupled by a common contact region and wherein controlled current input terminals of the second plurality of switching elements are insulated from each other; and wherein, for each of the first plurality of switching elements, the output terminal of the switching element is coupled with the input terminal of at least one switching element of the second plurality of switching elements.

21 Claims, 11 Drawing Sheets

＃ DIE PACKAGE

TECHNICAL FIELD

Embodiments generally relate to a die package.

BACKGROUND

Bridge circuits and similar circuits may be used in a lot of electrical circuitry for certain applications. It is desirable to have robust and cost efficient solutions for providing such circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
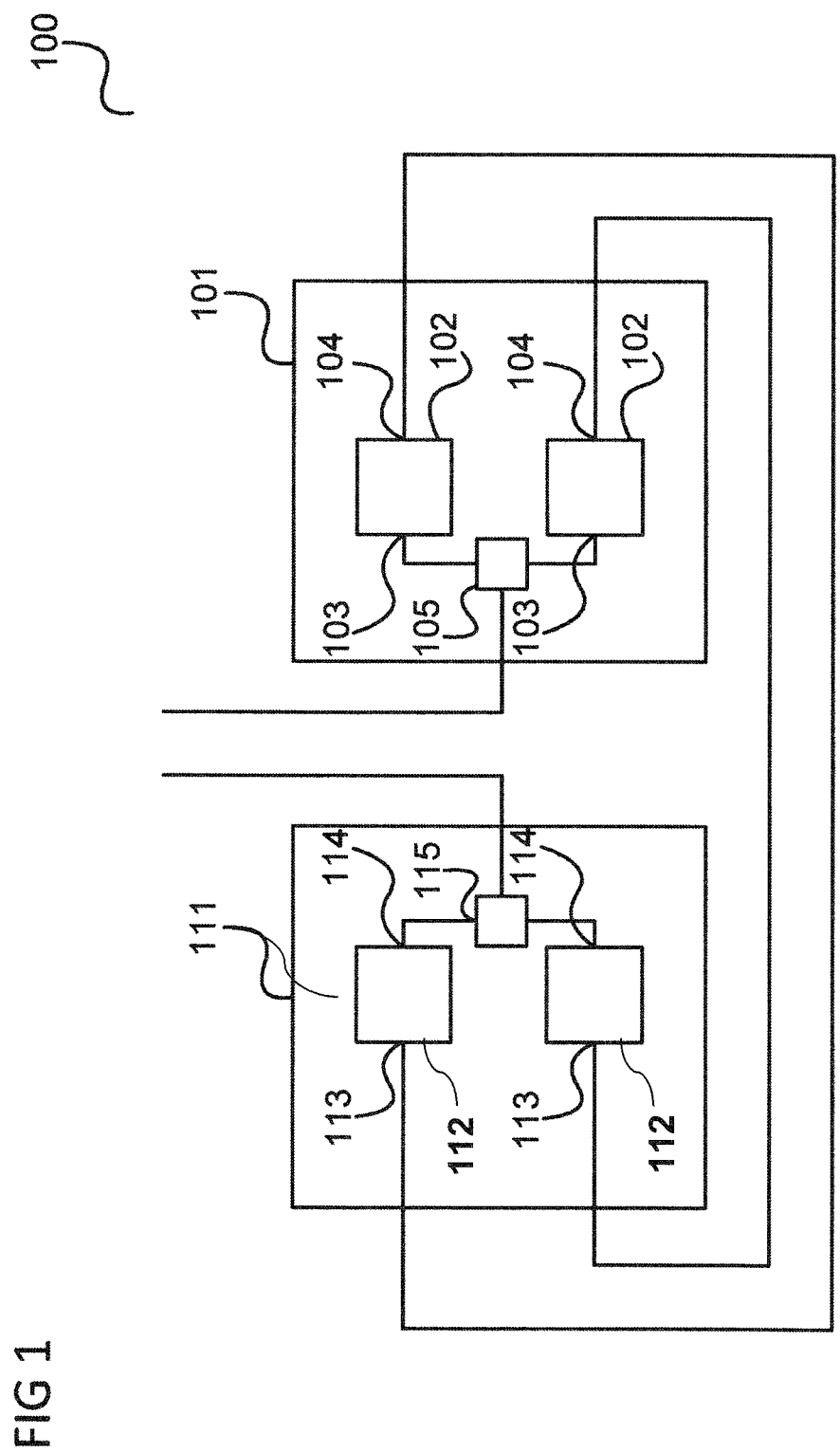
FIG. 1 shows a die package according to an embodiment.

According to one embodiment, a die package is provided as illustrated in FIG. 1.

FIG. 1 shows a die package 100 according to an embodiment.

The die package 100 includes a first die structure including 101 with a first plurality of switching elements 102 wherein each switching element 102 has a controlled current input terminal 103 and a controlled current output terminal 104 and the controlled current input terminals 103 of the first plurality of switching elements are electrically coupled by a common first contact region 105 of the first die structure 101 and wherein the controlled current output terminals 104 of the first plurality of switching elements 102 are electrically insulated from each other.

The die package 100 further includes a second die structure 111 including a second plurality of switching elements 112 wherein each switching element 112 has a controlled current input terminal 113 and a controlled current output terminal 114 and the controlled current output terminals 114 of the second plurality of switching elements are electrically coupled by a common second contact region 115 of the second die structure 111 and wherein the controlled current input terminals 113 of the second plurality of switching elements 112 are electrically insulated from each other.

For each of the first plurality of switching elements 102, the controlled current output terminal 104 of the switching element is electrically coupled with the controlled current input terminal 113 of at least one switching element of the second plurality of switching elements 112.

In one embodiment, in other words, a first die structure and a second die structure are provided within a single package, wherein each die structure includes a plurality of switching elements and the arrangement of the switching elements is, in one die structure, reversed with respect to the other die structure. For example, while the inputs of the switching elements in one of the die structures are at the bottom side of the chip or die (i.e., for example, at the side attached to the lead frame), the inputs of the switching elements in the other die structure are at the top side of the chip (i.e., for example on the chip side opposite to the side attached to the lead frame).

The die package 100 may for example implement a bridge circuit with a plurality of half bridge circuits (e.g. a 2, 3, ... phase bridge) in a single package (i.e. a single chip housing), for example by means of two monolithic Common Source/Common Drain MOSFET frontend technologies.

According to one embodiment, the number of switching elements of the first plurality of switching elements is equal to the number of switching elements of the second plurality of switching elements and for each of the first plurality of switching elements, the controlled current output terminal of the switching element is electrically coupled with the controlled current input terminal of exactly one switching element of the second plurality of switching elements. For example, the number of switching elements of the first plurality of switching elements and the number of switching elements of the second plurality of switching elements is two or three.

In one embodiment, the first die structure includes a first die paddle, a first die, and first interconnects and the second die structure includes a second die paddle, a second die, and second interconnects. The first die paddle for example realizes the common first contact region. The first die for example includes doped regions to realize the first plurality of switching elements (e.g. drain regions, source regions). The second die for example includes doped regions to realize the second plurality of switching elements (e.g. drain regions, source regions). The second die paddle for example realizes the common second contact region. The first interconnects and/or the second interconnects for example realize the electrical coupling of the controlled current output terminals of the first plurality of switching elements with the controlled current input terminals of the second plurality of switching elements.

The switching elements of the first plurality of switching elements and the second plurality of switching elements are for example semiconductor switching elements.

The switching elements of the first plurality of switching elements and the second plurality of switching elements may for example be power semiconductor switching elements.

In one embodiment, the switching elements of the first plurality of switching elements and the second plurality of switching elements are field effect switching elements wherein for each switching element, the current flow between the controlled current input terminal and the controlled current output terminal of the switching element is controlled by field effect. For example, each switching element of the first plurality of switching elements and the second plurality of switching elements includes a control input for controlling current flow between the controlled current input terminal and the controlled current output terminal of the switching element.

The switching elements of the first plurality of switching elements and the second plurality of switching elements may for example be field effect transistors (such as MOSFETs) or IGBTs.

In one embodiment, the switching elements of the first plurality of switching elements and the second plurality of switching elements are field effect transistors and the controlled current input terminals are drain terminals.

In one embodiment, the switching elements of the first plurality of switching elements and the second plurality of switching elements are field effect transistors and the controlled current output terminals are source terminals.

The switching elements of the first plurality of switching elements and the second plurality of switching elements are for example connected (e.g. within the die package 100) to form a bridge circuit.

The die package 100 may further include an input terminal connected to the common first contact region. The die package 100 may further include an output terminal connected to the common second contact region.

The one embodiment, the die package 100 further includes at least one temperature sensing circuit and at least one temperature sensing terminal for outputting a signal indicating a temperature of at least one switching element of the first plurality of switching elements and the second plurality of switching elements.

The common first contact region is for example electrically isolated from the common second contact region.

The die package 100 for example further includes a first lead frame and a second lead frame, wherein the first die structure is attached to the first lead frame and the second die structure is attached to the second lead frame.

In one embodiment, the first die structure is attached to the first lead frame by means of the common first contact region and the second die structure is attached to the second lead frame by means of the common second contact region. The first lead frame and the second lead frame are for example electrically isolated from each other within the die package.

In one embodiment, a die arrangement is provided including the die package 100, a power supply, and a load, wherein the common first contact region is connected to the power supply (for power input to the die package 100), the common second contact region is connected to a ground potential and the controlled current output terminals of the first plurality of switching elements are connected to the load. For example, the load is an electrical motor.

In other words, the die package 100 described above with reference to FIG. 1 may for example be used as a control chip for a motor. This is illustrated in FIG. 2.

Figure 2:
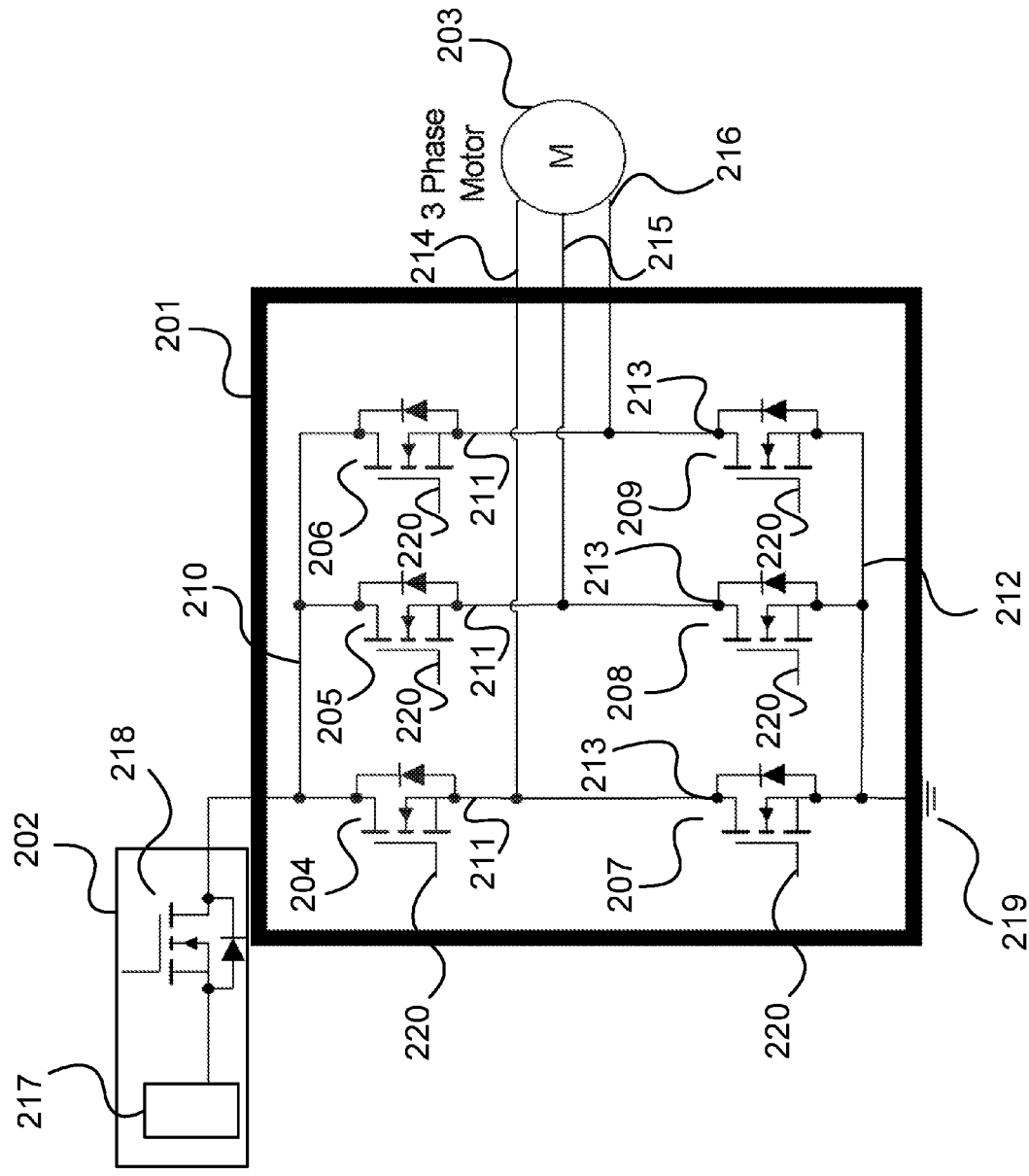
FIG. 2 shows a circuit arrangement according to an embodiment.

FIG. 2 shows a circuit arrangement 200 according to an embodiment.

The circuit arrangement 200 includes a die package 201, a power supply circuit 202 and a motor 203.

The die package 201 for example corresponds to the die package 100 shown in FIG. 1, wherein a first MOSFET (Metal Oxide Semiconductor Field Effect Transistor) 204, a second MOSFET 205, and a third MOSFET 206 correspond to the first plurality of switching elements 102 and a fourth MOSFET 207, a fifth MOSFET 208, and a sixth MOSFET 209 correspond to the second plurality of switching elements 112. It should be noted that in this example, each of the MOSFETs 204-209 is shown in parallel with its parasitic diode.

The first MOSFET 204, the second MOSFET 205, and the third MOSFET 206 include a common drain terminal 210 which may be seen to correspond to the common contact region of the controlled current input terminals (i.e. the drains) of the first MOSFET 204, the second MOSFET 205, and the third MOSFET 206.

The first MOSFET 204, the second MOSFET 205, and the third MOSFET 206 further include separate source terminals 211 which may be seen to correspond to the controlled current output terminals (i.e. the sources) of the first MOSFET 204, the second MOSFET 205, and the third MOSFET 206. The source terminals 211 being "separate" source terminals can be understood as the source terminals 211 being isolated from each other, at least within the die package 201.

The fourth MOSFET 207, the fifth MOSFET 208, and the sixth MOSFET 209 include a common source terminal 212 which may be seen to correspond to the common contact region of the controlled current output terminals (i.e. the sources) of the fourth MOSFET 207, the fifth MOSFET 208, and the sixth MOSFET 209.

The fourth MOSFET 207, the fifth MOSFET 208, and the sixth MOSFET 209 further include separate drain terminals 213 which may be seen to correspond to the controlled current input terminals (i.e. the drains) of the fourth MOSFET 207, the fifth MOSFET 208, and the sixth MOSFET 209. The drain terminals 213 being "separate" drain terminals can be understood as the drain terminals 211 being isolated from each other, at least within the die package 201.

The source terminal 211 of the first MOSFET 204 is connected with the drain terminal 213 of the fourth MOSFET 207 and with a first input 214 of the motor 203. The source terminal 211 of the second MOSFET 205 is connected with the drain terminal 213 of the fifth MOSFET 208 and with a second input 215 of the motor 203. The source terminal 211 of the third MOSFET 206 is connected with the drain terminal 213 of the sixth MOSFET 209 and with a third input 216 of the motor 203.

The MOSFETs 204 to 209 are controlled via respective (separate) gate terminals 220. The gate terminals 220 may for example be connected to a control circuit (not shown). For example, the gate terminals 220 may be connected to control input terminals of the die package (not shown) via which they may be connected to the control circuit.

The power supply 202 for example supplies power of a battery 217 via a reverse battery protection circuit 218 to the common drain terminal 210 of the first MOSFET 204, the second MOSFET 205, and the third MOSFET 206. The first MOSFET 204, the second MOSFET 205, and the third MOSFET 206 may thus be regarded as the high side MOSFETs of the circuit arrangement 200.

The common source terminal 212 of the fourth MOSFET 207, the fifth MOSFET 208, and the sixth MOSFET 209 is connected to a ground terminal 219. The fourth MOSFET 207, the fifth MOSFET 208, and the sixth MOSFET 209 may thus be regarded as the low side MOSFETs of the circuit arrangement 200.

The circuitry of the die package 201 may be seen to form a bridge circuit. The first MOSFET 204 and the fourth MOSFET 207 may be seen to form a half bridge. Similarly, the second MOSFET 205 and the fifth MOSFET 208 may be seen to form a half bridge and the third MOSFET 206 and the sixth MOSFET 209 may be seen to form a half bridge.

The motor 203 is in this example a three phase motor, i.e. a motor with three phase inputs 214, 215, 216.

In one embodiment, the circuitry of the die package 201 implements a motor control circuit for a two phase motor. For example, the die package 201 may only include the first MOSFET 204, the second MOSFET 205, the fourth MOSFET 207, and the fifth MOSFET 208 in this case.

The MOSFETs 204 to 209 are for example power MOSFETs. It should be noted that the MOSFETs 204 to 209 may, in other embodiments, be other types of field effect transistors or other semiconductor switching elements (e.g. semiconductor power switching elements) like for example IGBTs (Insulated Gate Bipolar Transistors).

A motor control circuit such as the one implemented by the die package 201 may also be realized using separate MOSFETs, i.e. MOSFETs each having its own housing, package, lead frame and/or chip. For example, a control circuit for a three phase motor may be implemented using six single MOSFET packages (i.e. packages with a single MOSFET per package) and a control circuit for a two phase motor may be implemented using four single MOSFET packages. The die package 201 may be seen as a single package solution for implementing such a motor control circuit in contrast to a multi package solution such as using six or for single MOSFET packages. It should be noted that a multi package solution may be used to achieve isolation of the drain terminals of the low side MOSFETs from each other, e.g. to have drain terminals which are each bound to a lead frame such that the lead frames are isolated from each other.

Alternatively, a module solution may be used which may, however, lead to high costs and a high assembly effort.

The die package 201 may be seen to allow implementation of a three phase bridge circuit (or also a two phase bridge circuit for example as mentioned above) within a single package. This may for example be achieved by using a Common Source technology, e.g. a Common Source MOSFET frontend technology. In one embodiment, a Common Source technology may be used for implementing a plurality of half bridges in a single package including only two die paddles. This leads to a reduction of complexity which may allow providing a solution for a motor controlling circuit at reduced cost compared to solutions based on single element packages (e.g. single MOSFET packages) or modules.

An example for a realization of the die package 201 based on Common Source technology is described in the following.

Figure 3:
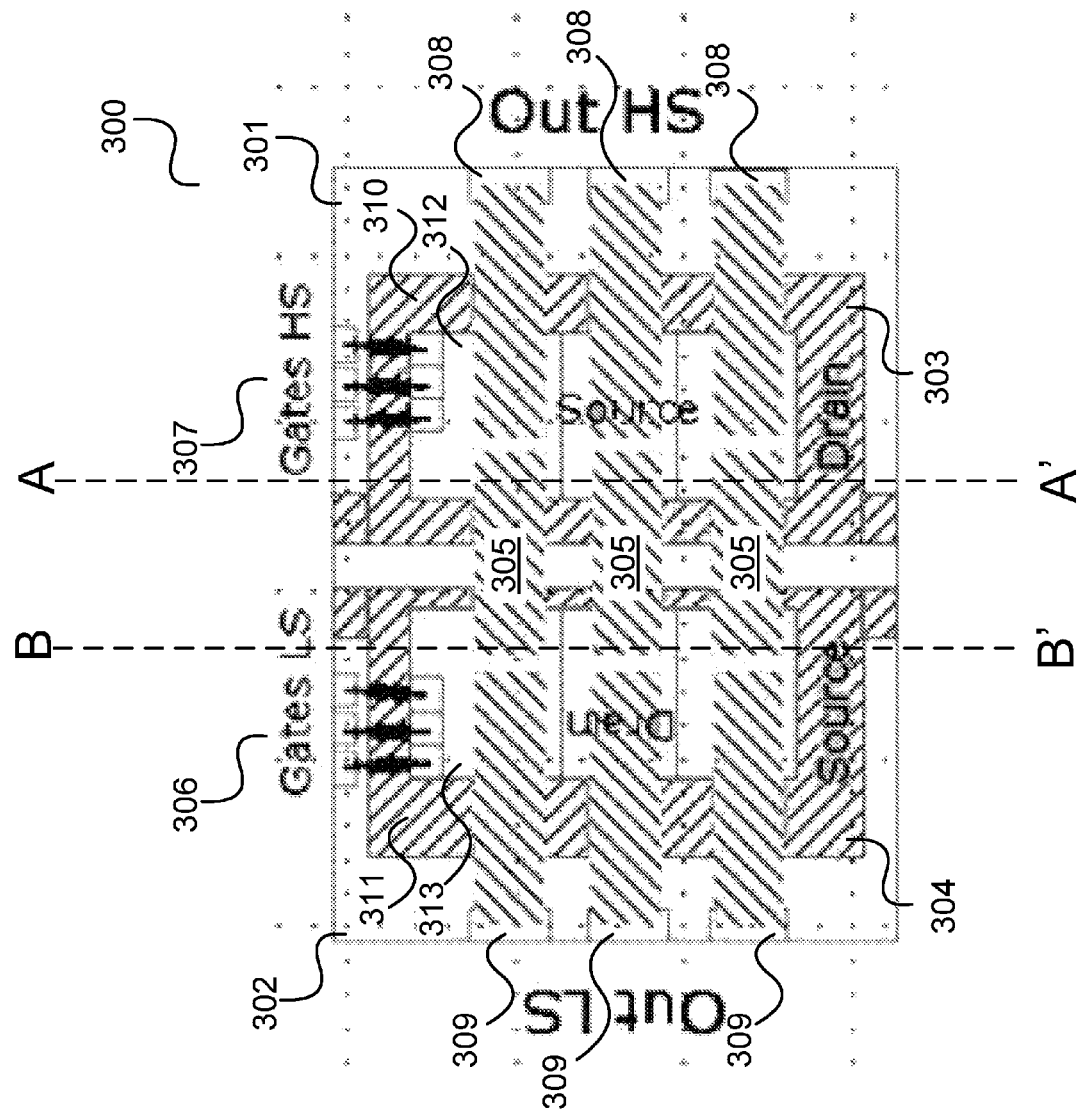
FIG. 3 shows a die package according to an embodiment.

FIG. 3 shows a die package 300 according to an embodiment.

The die package 300 includes a first die structure 301 and a second die structure 302, in this example a second die paddle 302.

The first die structure 301 includes a first die paddle 310. A first die 312 is placed on top of the first die paddle 310. The second die structure 302 includes a second die paddle 311. A second die 313 is placed on top of the second die paddle 311. The first die paddle 310 and the second die paddle 311 are each for example part of a lead frame.

In one embodiment, alternatively to the usage of a lead frame and die paddles 310, 311, the die package can also be realized by means of "chip embedding", wherein the electrical connections and contacts are realized by lithographically patterned conductive paths.

In this embodiment, the first die structure 301 realizes three MOSFETs in Common Drain technology (e.g. NMOS technology) and the second die structure 302 realizes three MOSFETs in Common Source technology (e.g. PMOS technology). In another embodiment, the first die structure 301 realizes three MOSFETs in Common Source technology (e.g. in PMOS technology) and the second die structure 302 realizes three MOSFETs in Common Drain technology (e.g. in NMOS technology).

A common drain terminal 303 of the first die structure 301 (located at the bottom of the first die structure 301 in the view of FIG. 3) corresponds to the common drain terminal 210 in FIG. 2 and a common source terminal 304 of the second die structure 302 (located at the bottom of the second die structure 302 in the view of FIG. 3) corresponds to the common source terminal 212 in FIG. 2.

The source terminals of the MOSFETS of the first die structure 301 (corresponding to the separate source terminals 211 in FIG. 2) are electrically connected to the drain terminals of the MOSFETS of the second die structure 302 (corresponding to the separate drain terminals 213 in FIG. 2), for example by means of ribbons 305 or, alternatively, by wires or clips.

The common drain terminal 303 of the first die structure 301 may be attached (die attach) to a lead frame of the first die structure 301 by means of, for example, soldering or gluing. Similarly, the common source terminal 304 of the second die structure 302 may be attached to a lead from of the second die structure 302. The lead frame of the first die structure 301 and the lead frame of the second die structure 302 are, in this embodiment, separate lead frames. For example, the lead frame of the first die structure 301 and the lead frame of the second die structure 302 are electrically isolated within the die package 300.

The gate terminals of the MOSFETs of the first die structure 301 and the second die structure 302 are in this example be connected to high side control input terminals 306 and low side control input terminals 307 of the die package 300. The gate terminals of the MOSFETs may be connected to the high side control input terminals 306 and the low side control input terminals 307 for example using bonding wires, buried interconnection paths isolated from the source and drain regions etc.

High side terminals 308 and low side terminals 309 of the die package 300 which may be, in the die arrangement 200 of FIG. 2, connected to respective inputs 214, 215, 216 of the motor 203 may be connected to the respective source terminals of the high side MOSFETs (i.e. the MOSFETS of the first die structure 301) and to the respective drain terminals of the low side MOSFETs (i.e. the MOSFETS of the first die structure 301), in this example by the ribbons 305. The connections (e.g. metal paths) for connecting the high side terminals 308 to the source terminals of the high side MOSFETs and the low side terminals to the drain terminals of the low side MOSFETs and the connections (e.g. metal paths) for connecting the high side control input terminals 306 with the gate terminals of the high side MOSFETs and the low side control input terminals 307 with the gate terminals of the low side MOSFETs may be isolated and separated from each other to avoid short circuits. This may be advantageous with regarding pin FMEA (Failure Mode Effects Analysis).

In one embodiment, the die package 300 may include a current sensor and/or a temperature sensor.

The realization of the first die structure 301 using Common Drain technology is explained in the following with reference to FIG. 4.

Figure 4:
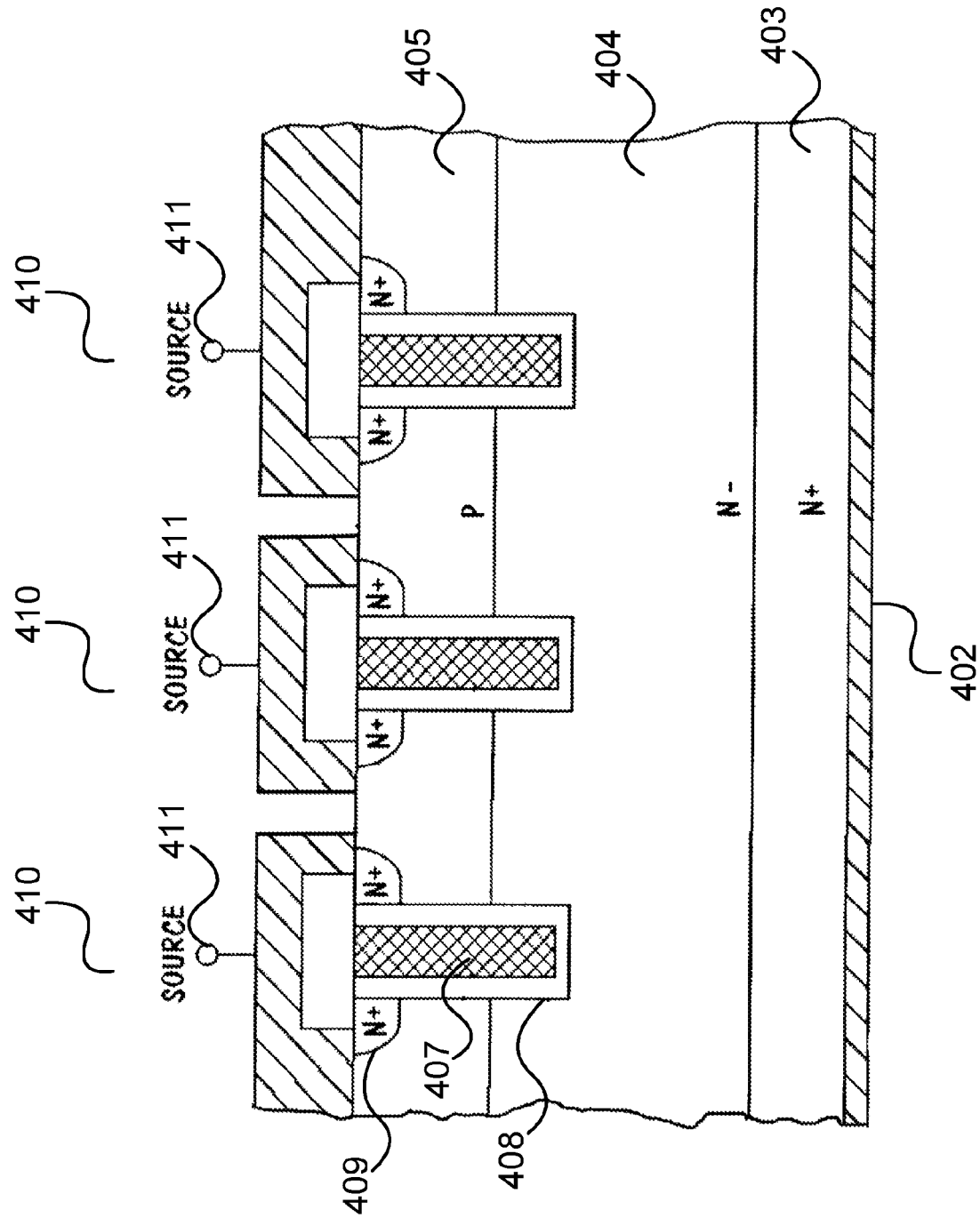
FIG. 4 shows a cross section of a die structure.

FIG. 4 shows a cross section of a die structure 400.

The cross section of the die structure 400 may be seen to correspond to a section of the first die structure 301 of FIG. 3 along the axis A-A'.

The die structure 400 includes three MOSFETs 410 corresponding to the MOSFETs of the first die structure 301 of FIG. 3. Each MOSFET 410 includes a source terminal 411 and a trench gate 407 insulated from the semiconductor substrate by an oxide layer 408. The die structure 400 includes a common drain terminal 402 of the MOSFETs 410. A gate 407 extends down through p-type layer 405 into n-type layer 404, which is disposed above N+ drain region 403. Source regions 409 adjoin gate 407 at the upper surface of the substrate. When a one of the MOSFETs 410 is switched on, current flows vertically from the source terminal 411 of the MOSFET 410 into the source regions 409 of the MOSFET 410, down through the channel regions formed adjacent to the gate 407 of the MOSFET 410, across extended drain region 404 and drain region 403 MOSFET 410, to the common drain electrode 402 of the MOSFETs 410.

A realization of the second die structure 303 using Common Source technology according to one embodiment is explained in the following with reference to FIG. 5.

Figure 5:
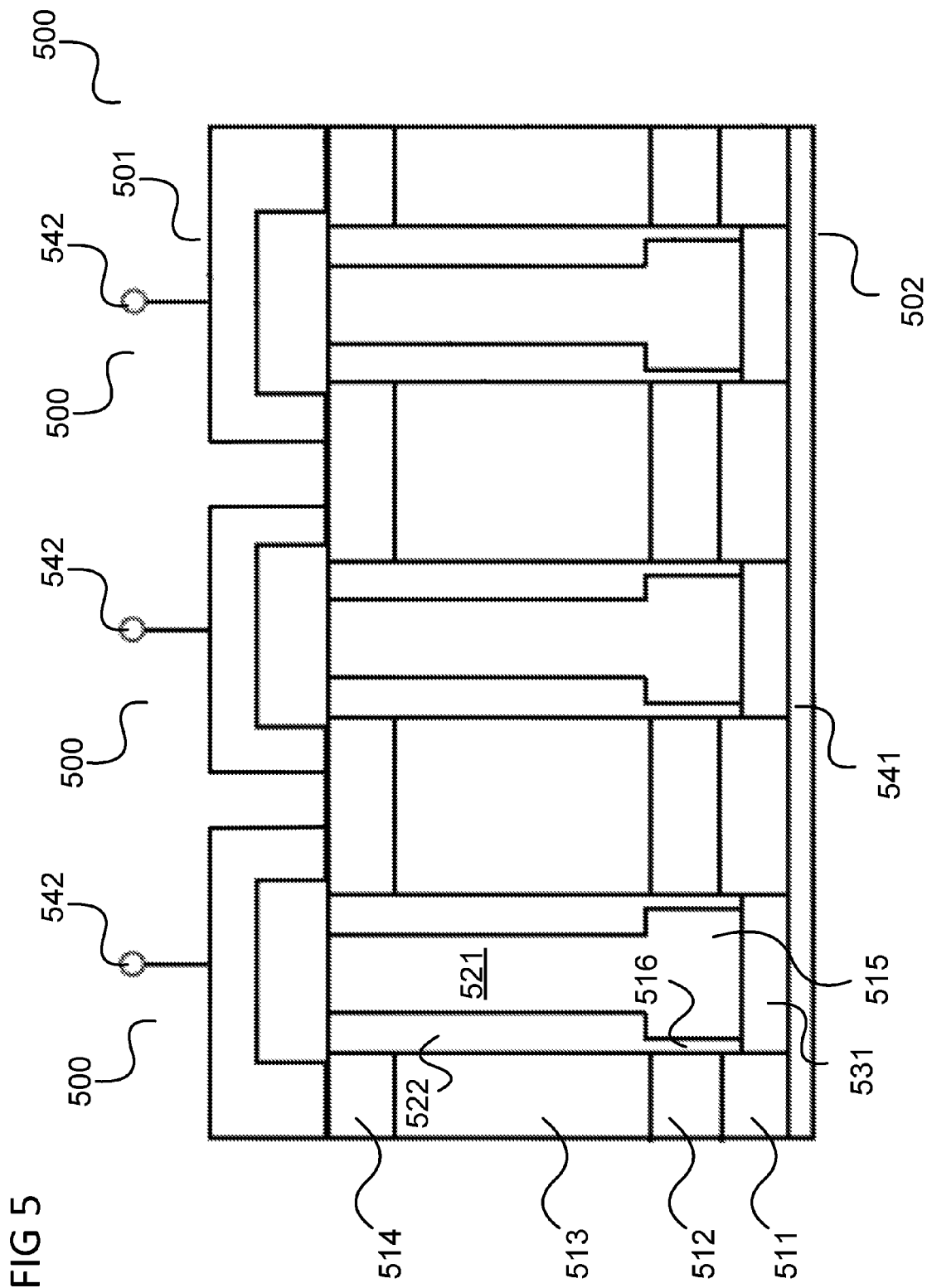
FIG. 5 shows a cross section of a die structure.

FIG. 5 shows a cross section of a die structure 500.

The cross section of the die structure 500 may be seen to correspond to a section of the second die structure 302 of FIG. 3 along the axis B-B'.

The die structure 500 includes three MOSFETs 510 corresponding to the MOSFETs of the second die structure 302 of FIG. 3. The die structure 500 includes a semiconductor body with a first surface 501 and with a second surface 502 which is opposite to the first surface 501.

The semiconductor body can include any suitable semiconductor material, such as silicon (Si), silicon carbide (SiC), gallium arsenide (GaAs), or galliumnitride (GaN).

For each MOSFET 510, the semiconductor body includes a drift region 513 of a first conductivity type, and a source region 511 and a body region 512 arranged between the drift region 513 and the second surface 502.

The source region 511 is of the first conductivity type and the body region 512 is of the second conductivity type and is arranged between the source region 511 and the drift region 513. A drain region 514 is arranged between the drift region 513 and the first surface 501. The source region 511 and the body region 512 are more highly doped than the drift region 513 and the drain region 514 is more highly doped than the drift region 513. The doping concentration of the drift region 513 is, for example, in the range of between $10^{15}$ cm$^{-3}$ and $10^{17}$ cm$^{-3}$, the doping concentration of the body region 512 is, for example, in the range of between $10^{16}$ cm$^{-3}$ and $10^{18}$ cm$^{-3}$, the doping concentration of the source region 511 is, for example, in the range of between $10^{19}$ cm$^{-3}$ and $10^{21}$ cm$^{-3}$, and the doping concentration of the drain region 514, is, for example, in the range of between $10^{19}$ cm$^{-3}$ and $10^{21}$ cm$^{-3}$.

The drain region 514 is of the same conductivity type as the drift region 13, but more highly doped.

In this example, the MOSFETs 510 are n-channel MOSFETs. Therefore, the drift region 513 and the source region 511 are n-doped, while the body region 512 is p-doped.

In one embodiment where a PMOS Common Source technology is used, the drift region 513 and the source region 511 may be p-doped while the body region 512 may be n-doped.

Each MOSFET 510 further includes a gate electrode 515. The gate electrode 515 is implemented as a trench electrode which is arranged in a trench that extends from the first surface 501 into the semiconductor body 520. The gate electrode 515 is arranged adjacent to the body region 512 and in the vertical direction of the semiconductor body 500 extends from the drift region 513 through the body region 512 to the source region 511.

The gate electrode 515 is dielectrically insulated from the body region 512 and the source region 511 and the drift region 513 regions by a gate dielectric 516. The gate electrode 515 can include any suitable gate electrode material, like a doped polycrystalline semiconductor material, such as polysilicon, or a metal.

The gate dielectric 516 may include any suitable gate dielectric material, like an oxide, such as silicon oxide (SiO2), a nitride, or a high-k dielectric.

The MOSFETs 510 have a common source terminal 541 that electrically contacts the source regions 511 of the MOSFETs 510. The source terminal 541 is arranged below the second surface 501, is electrically insulated from the gate electrode 515 by a gate insulation layer 531 and may be attached to a lead frame of the die paddle 500.

For each MOSFET 510, a gate connection electrode 521 which is electrically connected to the gate electrode 515 extends through the drift region 513 and the drain region 514 to the first surface 501 and is dielectrically insulated from these semiconductor regions 513, 514 by a dielectric layer 522. The dielectric layer 522 can be made of the same material like the gate dielectric 516, but can also be made of a different dielectric material. According to one embodiment the dielectric layer 522 of the gate connection electrode 521 is thicker than the gate dielectric 516, i.e. a distance between the gate connection electrode 521 and its surrounding semiconductor region is larger than the distance between the gate electrode 515 and the body region 512.

Each MOSFET 510 includes a drain terminal 542 which electrically contacts the drain region 514. The gate electrode 515 may be electrically connected to a gate contact electrode (not shown) which forms a gate terminal of the MOSFET 510 which is for example arranged on the first surface 501 of the die structure 500, for example corresponding to one of the low side control input terminals 307. The gate electrode 515 may be electrically connected to the gate terminal via the gate connection electrode 521 and, for example, via a metal path perpendicular to the cross section of FIG. 5.

Another realization of the second die structure 303 according to one embodiment is explained in the following with reference to FIG. 6.

Figure 6:
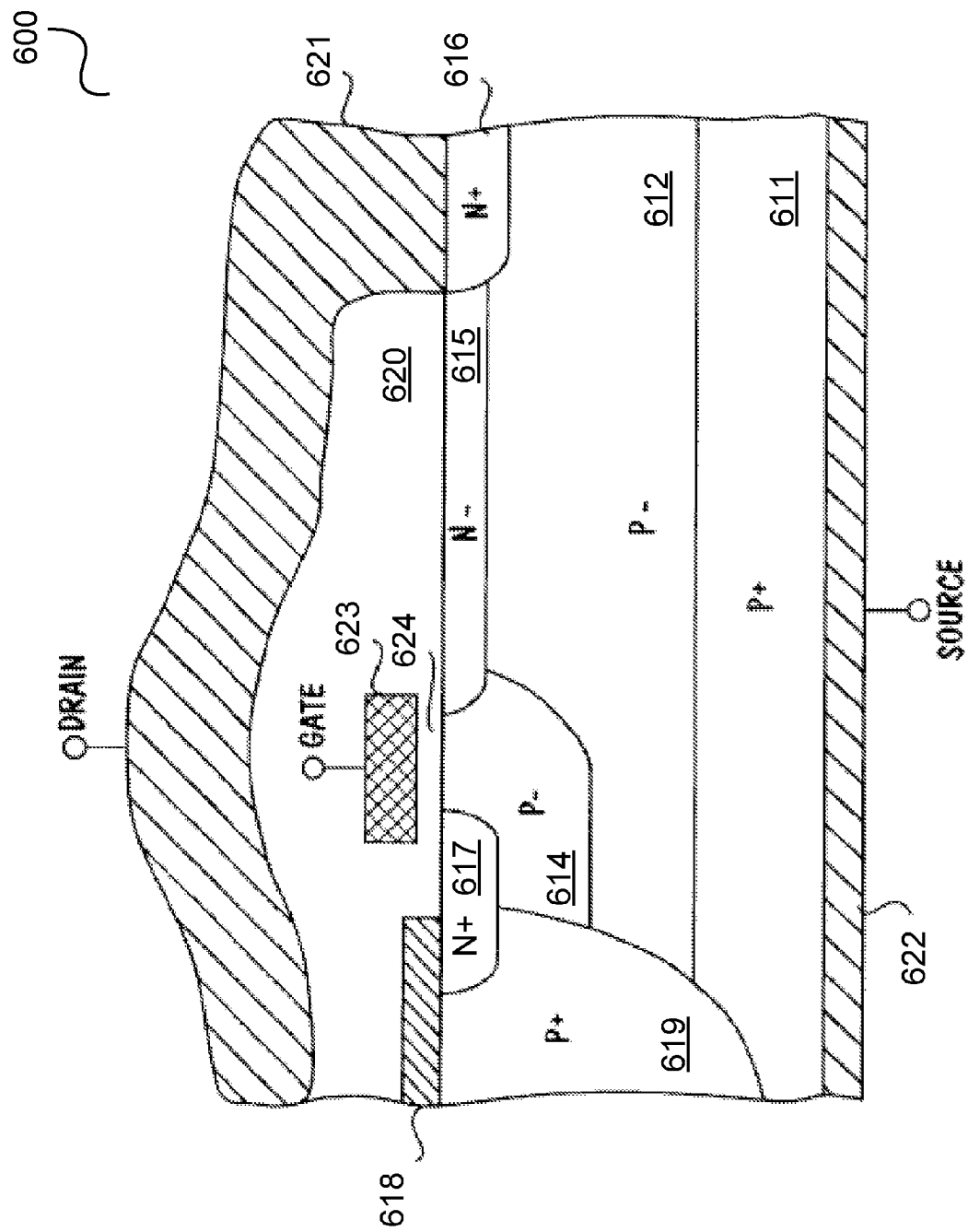
FIG. 6 shows a cross section of a die structure.

FIG. 6 shows a cross section of a die structure 600.

The cross section of FIG. 6 may be seen to be a cross section along B-B' in FIG. 3 but showing only a part corresponding to one MOSFET. The other MOSFETs of the second die structure 303 may be implemented analogously and the source terminals may be connected, e.g. by attaching them to a common lead frame.

The die structure 600 includes a MOSFET having a gate 623 (included, for example, of polysilicon), and a gate-insulating layer 624 that insulates gate 623 from the underlying semiconductor regions. Gate-insulating layer 624 may include ordinary silicon dioxide or another appropriate dielectric insulating material. In one embodiment gate 623 includes polysilicon formed with a silicide top layer to reduce gate resistance. The gate 623 may for example be about 1 micron long and insulating layer 624 may for example be approximately 300-500 angstroms thick.

The MOSFET of the die structure 600 also includes a source region 617 and a drain region 616. Both regions 616, 617 are in this example highly doped (N+) with arsenic and are for example formed to a depth of about 0.3 microns. An extended drain region 615 connects with drain region 616. To achieve a breakdown voltage of around 10-20V, extended drain region may for example be fabricated about 1.0 microns long and 0.3-0.5 microns thick.

The die structure 600 includes a P-type region 614 is shown formed in P-type semiconductor (e.g., epitaxial) layer 612 separating the extended drain region 615 from source region 617. Region 614 prevents punch-through between the source and drain. P-type region 614 also controls the threshold voltage of the transistor and prevents the parasitic NPN bipolar transistor from turning on. By way of example, P-type region 614 may be formed with a diffusion of implanted boron impurities.

Gate 623 may slightly overlap N+ source region 617 and the extended drain region 615 to provide continuous conduction in the channel region of the MOSFET. The overlap with region 614 also enables higher breakdown voltage of the device. However, the overlap between layers 614, 615 is not required for the operation. The channel region of the MOSFET is defined at one end by the N+ source region 617 and at the other end by N-type extended drain region 615. A channel of electrons is formed along the wafer surface in P-type region 614 of regions 614 and 612, if there is no overlapping of regions 614, 615 just below gate 623 when the MOSFET is turned on by application of a sufficient voltage to the gate. The thickness of gate insulating layer 624 is for example made sufficiently large (e.g. 300-500 angstroms) to avoid high gate capacitance.

Epitaxial layer 612 may be formed on top of a P+ substrate 611. To achieve a desired breakdown voltage in the device structure the charge in layer 612 may be balanced and optimized for a high BVD (breakdown voltage) and a low Rds (on). The epitaxial layer may for example be doped to about $10^{16}$ cm$^{-3}$ concentration and may be fabricated to be about 3 microns thick.

Substrate region 611 may be highly doped to provide a low resistance path for the current in the on-state. By way of example, substrate 611 may be formed with a resistivity of about 0.01-0.003 ohm cm with a thickness of about 250 microns. A source electrode 622 (source terminal) is formed along the bottom of the die structure 600 (e.g. at the wafer bottom) and is electrically connected to P+ substrate 611.

Metalization of the bottom surface of the die structure 600 in this manner facilitates future connection with a package electrode, e.g. attaching to a lead frame. In one embodiment, both the top and bottom metalization layers 621, 622, respectively, include layers of Ti, Ni, and Ag, each of sub-micron thickness. In another embodiment, the top layer 621 is Aluminum or Aluminum alloy.

Conducting region 618 may be disposed at the top surface of the wafer to electrically short or connect source region 617 with P+ region 619. Conducting region 618 may include any of a variety of metals, alloys, doped semiconductor material, suicides, etc., sufficient for this purpose. Region 619, which, for example, may be formed by a diffusion of boron, extends from the surface down to P+ substrate 611 to provide a low conductivity path between N+ source region 617 and source electrode 622. This connection facilitates high current flow to the source metalization along the bottom surface of the wafer.

Covering the top surface of the wafer is an interlayer dielectric 620, which may include silicon dioxide. Dielectric 620 electrically insulates gate 623 from drain metalization layer 621, which covers the entire surface area of the wafer over the transistor and contacts N+ drain region 616 (except for the small area of gate contact).

In the on state, a sufficient voltage is applied to the gate 623 (connected, e.g. by a metal path perpendicular to the picture plane of FIG. 6) such that a channel of electrons is formed along the surface of the P-body regions 614. This provides a path for electron current flow from source electrode 622, N+ source regions 617, through the channel regions formed in P-body regions 614, down through the N-type drift regions 615, through the N+ drain 616 and into the metal drain electrode 621.

Figure 7:
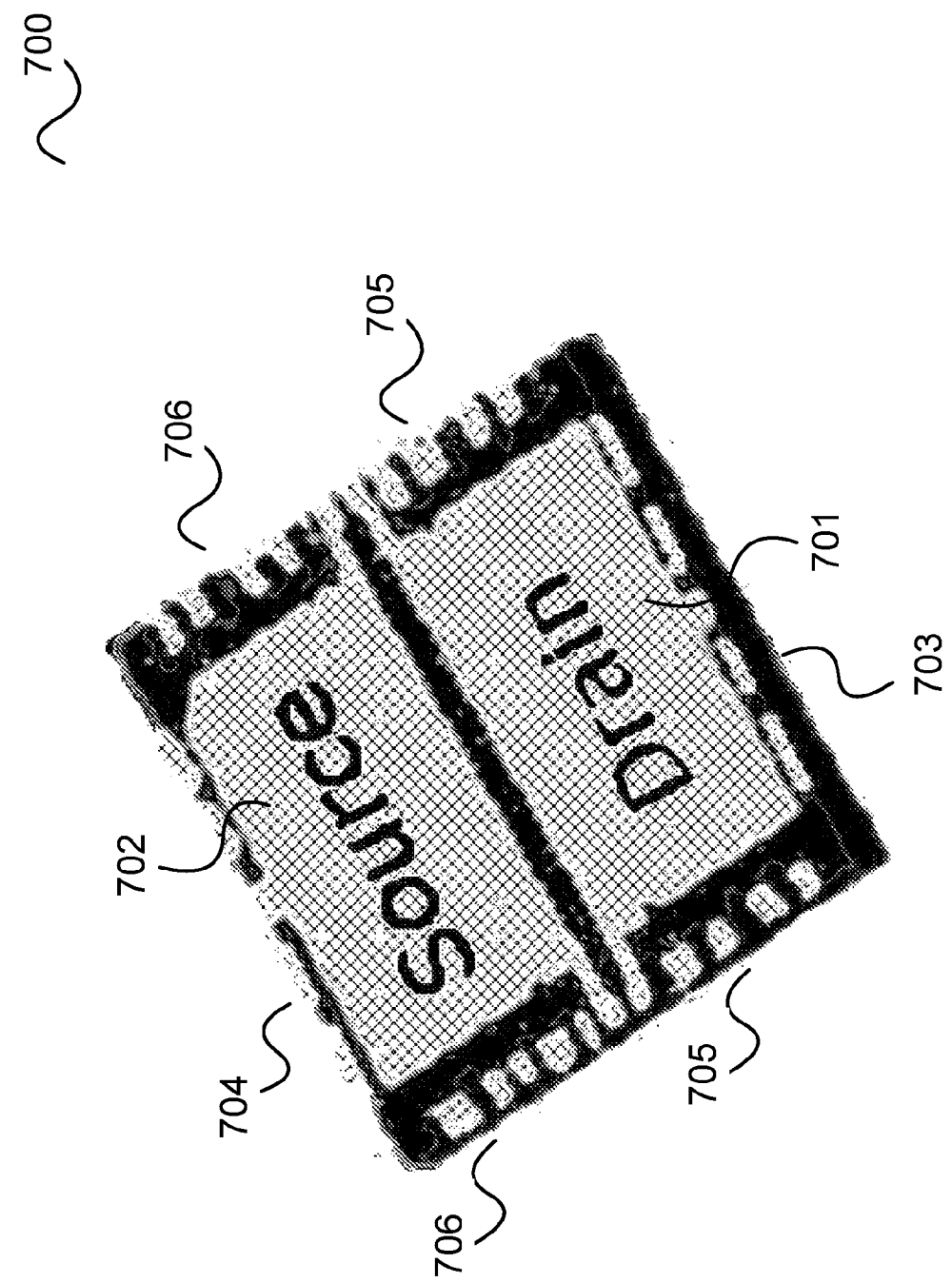
FIG. 7 shows a die package according to an embodiment.

Another view of the die package 300 of FIG. 3 according to one embodiment is shown in FIG. 7.

FIG. 7 shows a die package 700 according to an embodiment.

The die package 700 corresponds, in one embodiment, to the die package 300 of FIG. 3. The view given in FIG. 7 may be seen as a bottom view of the die package 300 of FIG. 3.

The die package 700 includes a drain terminal 701 corresponding to the common drain terminal 303 of the die package 300 of FIG. 3 and a source terminal 702 corresponding to the common source terminal 304 of the die package 300 of FIG. 3. The die package 700 further includes high side terminals 703 corresponding to the high side terminals 308 of the die package 300 of FIG. 3 and low side terminals 704 corresponding to the low side terminals 309 of the die package 300 of FIG. 3.

Additionally, the die package 700 includes high side control input terminals 705 corresponding to the high side control input terminals 306 of the die package 300 of FIG. 3 and low side control input terminals 706 corresponding to the low side control input terminals 307 of the die package 300 of FIG. 3.

It should be noted that in this example, the high side control input terminals 705 and the low side control input terminals 706 are arranged on two sides of the die package 700 while the high side control input terminals 306 and the low side control input terminals 307 of the die package 300 are arranged on only one side of the die package 300 as shown in FIG. 3.

It is also possible to arrange the high side control input terminals and the low side control input terminals on, with respect to the die package 300 of FIG. 3, the other side of the die package.

Figure 8:
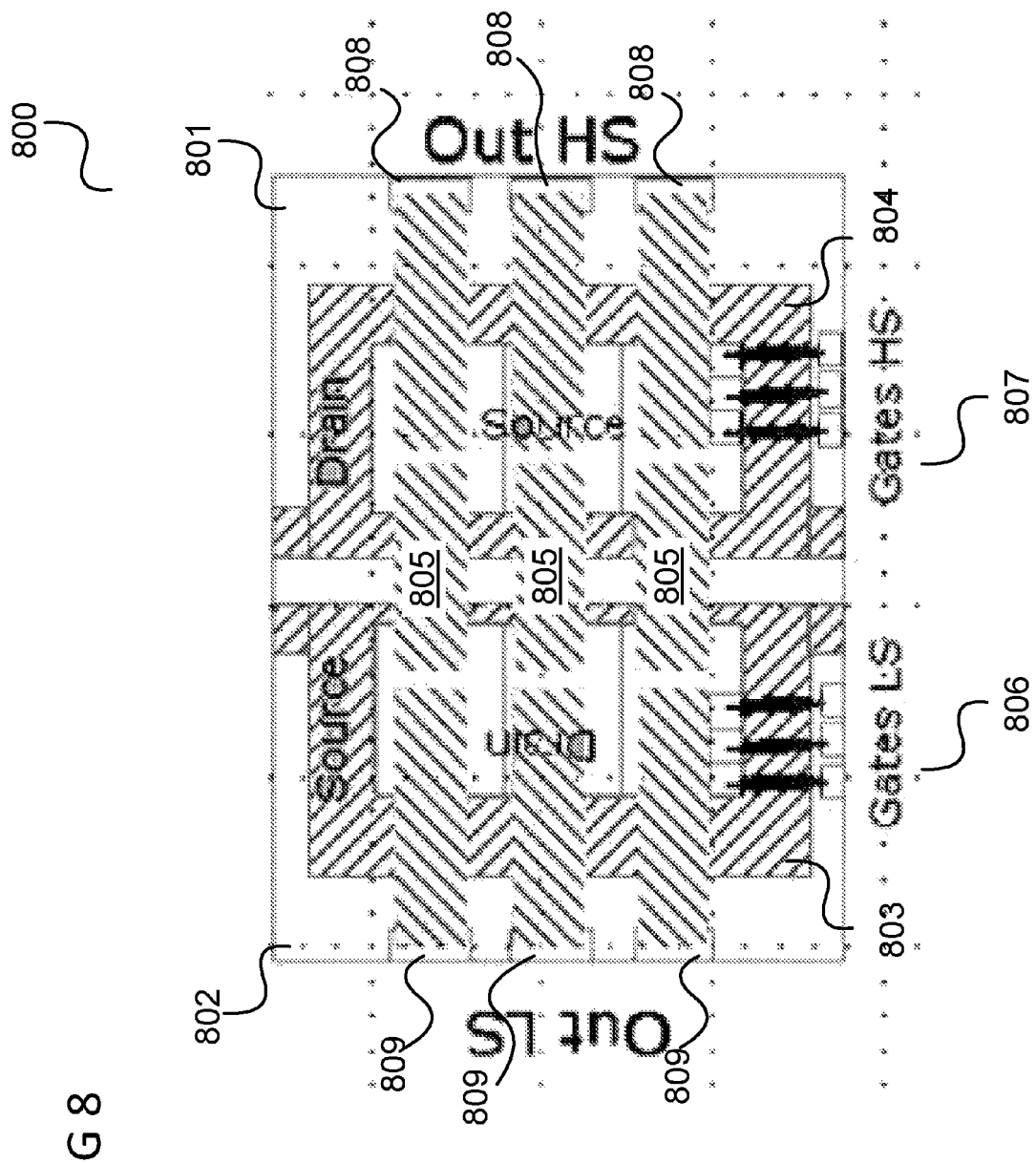
FIG. 8 shows a die package according to an embodiment.

This is illustrated in FIG. 8.

FIG. 8 shows a die package 800 according to an embodiment.

Analogously to the die package 300 of FIG. 3, the die package 800 includes a first die structure 801, a second die structure 802, a common drain terminal 803, a common source terminal 804, high side terminals 808 and low side terminals 809.

In this example high side control input terminals 806 and the low side control input terminals 807 are arranged at the other side of the die package 800 compared to the die package 300 of FIG. 3.

In one embodiment, the die package 300 includes temperature sensor terminals allowing monitoring the temperature of the MOSFETS of the die package 300. This is illustrated in FIG. 9.

Figure 9:
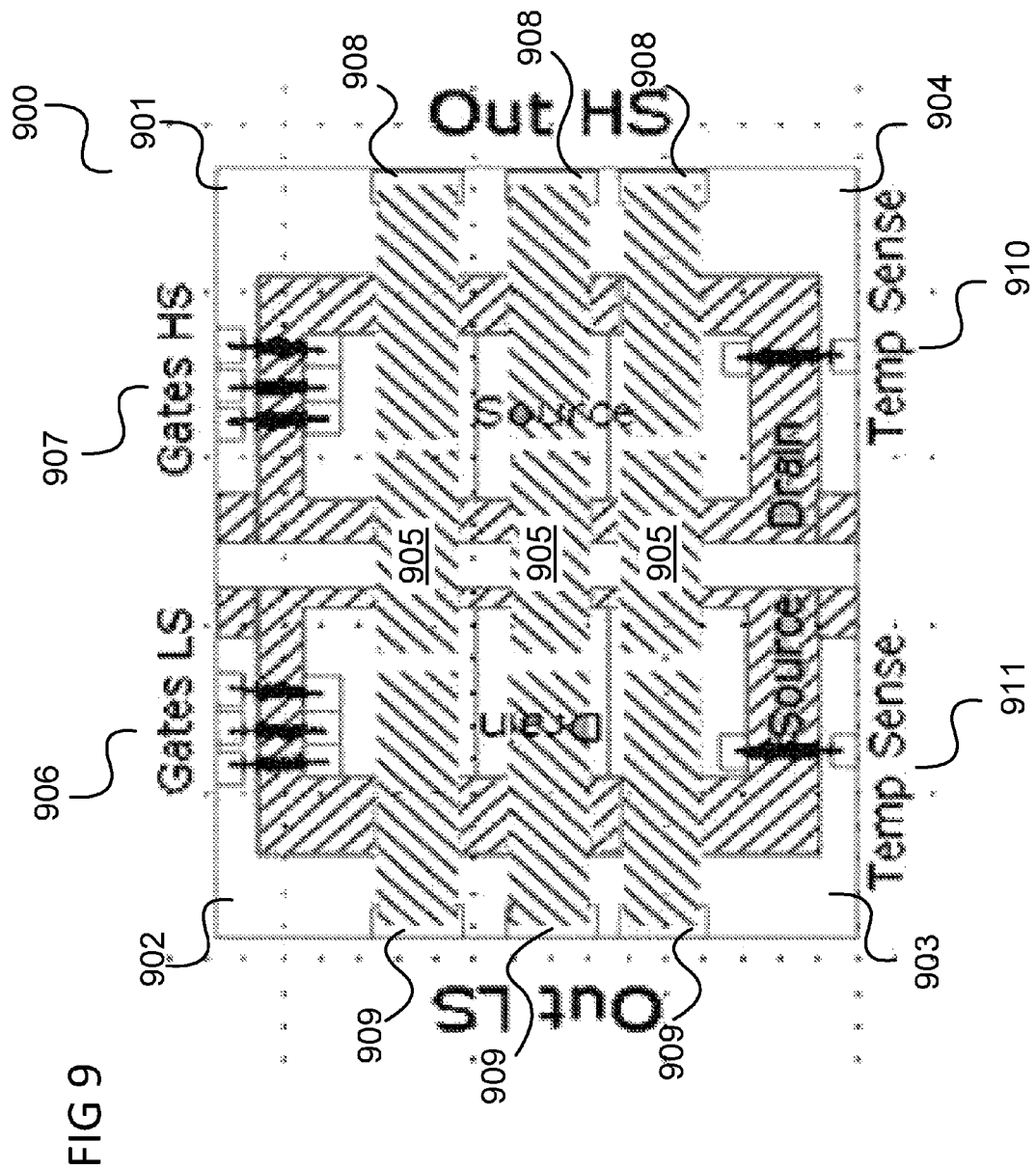
FIG. 9 shows a die package according to an embodiment.

FIG. 9 shows a die package 900 according to an embodiment.

Analogously to the die package 300 of FIG. 3, the die package 900 includes a first die structure 901, a second die structure 902, a common drain terminal 903, a common source terminal 904, high side terminals 908, low side terminals 909, high side control input terminals 906 and low side control input terminals 907.

In addition, the die package 900 includes a high side temperature sensing terminal 910 and a low side temperature sensing terminal 911. The die package 900 may also include a plurality of high side temperature sensing terminals 910 and/or a plurality of low side temperature sensing terminals 911, e.g. one high side temperature sensing terminals 910 or one low side temperature sensing terminals 911, respectively, for each MOSFET of the die package 900. Via the temperature sensing terminals 910, 911, the temperature of the MOSFETs of the die package 900 may be controlled, e.g. by means of temperature sensors thermally coupled with the MOSFETs of the high side or the low side, respectively.

While the die package 300 of FIG. 3 realizes three half bridges, for example for controlling a three phase motor, a die package is provided in one embodiment realizing a different number of half bridges, for example two half bridges, e.g. for controlling a two phase motor. This is illustrated in FIG. 10.

Figure 10:
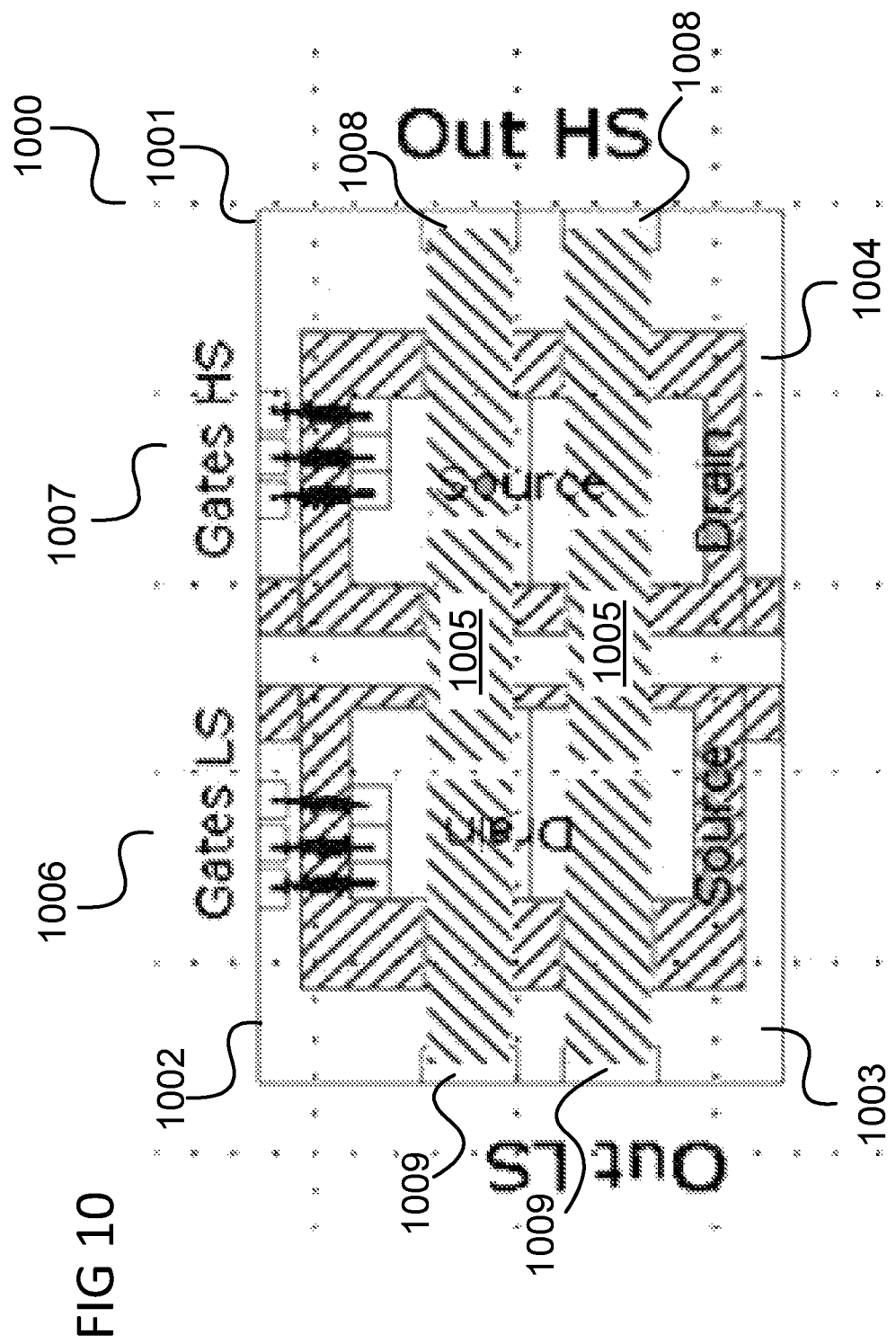
FIG. 10 shows a die package according to an embodiment.

FIG. 10 shows a die package 1000 according to an embodiment.

Analogously to the die package 300 of FIG. 3, the die package 1000 includes a first die structure 1001, a second die structure 1002, a common drain terminal 1003, a common source terminal 1004, high side terminals 1008, low side terminals 1009, high side control input terminals 1006 and low side control input terminals 1007.

In contrast to the die package 300 of FIG. 3, the die package 1000 realizes only two high side MOSFETs and two low side MOSFETs. Correspondingly, the die package 1000 only includes two high side terminals 1008, two low side terminals 1009, two high side control input terminals 1006 and two low side control input terminals 1007.

Figure 11:
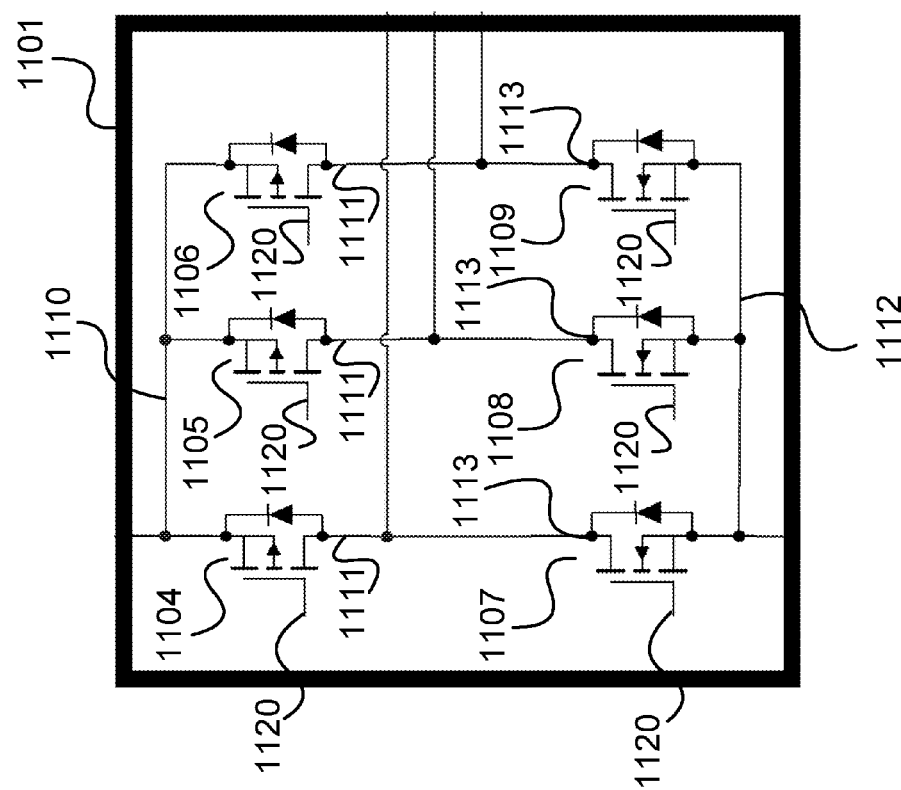
FIG. 11 shows a die package according to an embodiment.

A die package in which the high side MOSFETs are p-channel MOSFETs is illustrated in FIG. 11.

FIG. 11 shows a die package 1100 according to an embodiment.

Similarly to the die package 201 shown in FIG. 2, the die package 1100 includes a first MOSFET 1104, a second MOSFET 1105, a third MOSFET 1106, a fourth MOSFET 1107, a fifth MOSFET 1108, and a sixth MOSFET 1109.

In contrast to the die package 201 shown in FIG. 1, the first MOSFET 1104, the second MOSFET 1105, and the third MOSFET 1106 are, in this example, p-channel MOSFETs.

The first MOSFET 1104, the second MOSFET 1105, and the third MOSFET 1106 include a common source terminal 1110.

The first MOSFET 1104, the second MOSFET 1105, and the third MOSFET 1106 further include separate drain terminals 1111

The fourth MOSFET 1107, the fifth MOSFET 1108, and the sixth MOSFET 1109, are, as in the die package 201 shown in FIG. 2, n-channel MOSFETs and include a common source terminal 1112.

The fourth MOSFET 1107, the fifth MOSFET 1108, and the sixth MOSFET 1109 further include separate drain terminals 1113

The drain terminal 1111 of the first MOSFET 1104 is connected with the drain terminal 1113 of the fourth MOSFET 1107. The drain terminal 1111 of the second MOSFET 1105 is connected with the drain terminal 1113 of the fifth MOSFET 1108. The drain terminal 1111 of the third MOSFET 1106 is connected with the drain terminal 1113 of the sixth MOSFET 1109.

The MOSFETs 1104 to 1109 are controlled via respective gate terminals 1120.

The die package 1100 may for example be realized as shown in FIG. 3, except that on the high side, the die paddle 303 would in this case realize the common source terminal of the first MOSFET 1104, the second MOSFET 1105, and the third MOSFET 1106 and at the top of the first die 312 the drain regions of the first MOSFET 1104, the second MOSFET 1105, and the third MOSFET 1106 would in this case be contacted by the ribbons 305 (instead of the source regions).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die package comprising
a first die structure comprising a first plurality of switching elements
wherein each switching element has a controlled current input terminal and a controlled current output terminal and the controlled current input terminals of the first plurality of switching elements are electrically coupled by a common first contact region of the first die structure and wherein the controlled current output terminals of the first plurality of switching elements are electrically insulated from each other
a second die structure comprising a second plurality of switching elements wherein each switching element has a controlled current input terminal and a controlled current output terminal and the controlled current output terminals of the second plurality of switching elements are electrically coupled by a common second contact region of the second die structure and wherein the controlled current input terminals of the second plurality of switching elements are electrically insulated from each other
and wherein, for each of the first plurality of switching elements, the controlled current output terminal of the switching element is electrically coupled with the controlled current input terminal of at least one switching element of the second plurality of switching elements.

2. Die package according to claim 1, wherein the number of switching elements of the first plurality of switching elements is equal to the number of switching elements of the second plurality of switching elements and for each of the first plurality of switching elements, the controlled current output terminal of the switching element is electrically coupled with the controlled current input terminal of exactly one switching element of the second plurality of switching elements.

3. Die package according to claim 1, wherein the number of switching elements of the first plurality of switching elements and the number of switching elements of the second plurality of switching elements is two or three.

4. Die package according to claim 1, wherein the first die structure comprises a first die paddle, a first die, and first interconnects and the second die structure comprises a second die paddle, a second die, and second interconnects.

5. Die package according to claim 1, wherein the switching elements of the first plurality of switching elements and the second plurality of switching elements are semiconductor switching elements.

6. Die package according to claim 1, wherein the switching elements of the first plurality of switching elements and the second plurality of switching elements are power semiconductor switching elements.

7. Die package according to claim 1, wherein the switching elements of the first plurality of switching elements and the second plurality of switching elements are field effect switching elements wherein for each switching element, the current flow between the controlled current input terminal and the controlled current output terminal of the switching element is controlled by field effect.

8. Die package according to claim 1, wherein each switching element of the first plurality of switching elements and the second plurality of switching elements comprises a control input for controlling current flow between the controlled current input terminal and the controlled current output terminal of the switching element.

9. Die package according to claim 1, wherein the switching elements of the first plurality of switching elements and the second plurality of switching elements are field effect transistors or IGBTs.

10. Die package according to claim 1, wherein the switching elements of the first plurality of switching elements and the second plurality of switching elements are field effect transistors and the controlled current input terminals are drain terminals.

11. Die package according to claim 1, wherein the switching elements of the first plurality of switching elements and the second plurality of switching elements are field effect transistors and the controlled current output terminals are source terminals.

12. Die package according to claim 1, wherein the switching elements of the first plurality of switching elements and the second plurality of switching elements are connected to form a bridge circuit.

13. Die package according to claim 1, further comprising an input terminal connected to the common first contact region.

14. Die package according to claim 1, further comprising an output terminal connected to the common second contact region.

15. Die package according to claim 1, further comprising at least one temperature sensing circuit and at least one temperature sensing terminal for outputting a signal indicating a temperature of at least one switching element of the first plurality of switching elements and the second plurality of switching elements.

16. Die package according to claim 1, wherein the common first contact region is electrically isolated from the common second contact region.

17. Die package according to claim 1, further comprising a first lead frame and a second lead frame, wherein the first die structure is attached to the first lead frame and the second die structure is attached to the second lead frame.

18. Die package according to claim 17, wherein the first die structure is attached to the first lead frame by means of the common first contact region and the second die structure is attached to the second lead frame by means of the common second contact region.

19. Die package according to claim 17, wherein the first lead frame and the second lead frame are electrically isolated from each other within the die package.

20. Die arrangement comprising a die package according to claim 1, a power supply, and a load, wherein the common first contact region is connected to the power supply, the common second contact region is connected to a ground potential and the controlled current output terminals of the first plurality of switching elements are connected to the load.

21. Die arrangement according to claim 20 wherein the load is a motor.

* * * * *